US012813076B2

(12) United States Patent
Li et al.

(10) Patent No.: US 12,813,076 B2
(45) Date of Patent: Nov. 24, 2026

(54) DISPLAY PANEL AND MANUFACTURING METHOD THEREFOR, AND DISPLAY DEVICE

(71) Applicant: BOE Technology Group Co., Ltd., Beijing (CN)

(72) Inventors: Xiaohu Li, Beijing (CN); Huajie Yan, Beijing (CN); Lu Wang, Beijing (CN); Zhiqiang Jiao, Beijing (CN)

(73) Assignee: BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 632 days.

(21) Appl. No.: 17/784,449

(22) PCT Filed: Aug. 5, 2021

(86) PCT No.: PCT/CN2021/110862
§ 371 (c)(1),
(2) Date: Jun. 10, 2022

(87) PCT Pub. No.: WO2022/048389
PCT Pub. Date: Mar. 10, 2022

(65) Prior Publication Data

US 2023/0006011 A1 Jan. 5, 2023

(30) Foreign Application Priority Data

Sep. 3, 2020 (CN) ......................... 202010917074.7

(51) Int. Cl.
*H01L 27/32* (2006.01)
*H10K 59/122* (2023.01)
(Continued)

(52) U.S. Cl.
CPC ..... *H10K 59/122* (2023.02); *H10K 59/80515* (2023.02); *H10K 59/1201* (2023.02); *H10K 71/00* (2023.02); *H10K 2102/351* (2023.02)

(58) Field of Classification Search
CPC . H10K 59/122; H10K 50/813; H10K 59/1201
(Continued)

(56) References Cited

U.S. PATENT DOCUMENTS 6,091,078 A * 7/2000 Codama ............... H10K 71/621 313/506
2007/0290604 A1 12/2007 Sakanoue et al.
(Continued)

FOREIGN PATENT DOCUMENTS

CN 102077689 B 5/2013
CN 103219354 A 7/2013
(Continued)

OTHER PUBLICATIONS

CN202010917074.7 first office action.
(Continued)

*Primary Examiner* — Dzung Tran
(74) *Attorney, Agent, or Firm* — IPro, PLLC

(57) ABSTRACT

Provided is a display panel. The display panel includes a base substrate; and a plurality of sub-pixels disposed on a side of the base substrate, each of the sub-pixels including: a first electrode, a light-emitting film layer, and a second electrode laminated in sequence along a direction going away from the base substrate, wherein the first electrode includes a first portion and a second portion surrounding the first portion, a thickness of the second portion being greater than a thickness of the first portion.

17 Claims, 8 Drawing Sheets

(51) Int. Cl.

| | |
|---|---|
| ***H10K 59/80*** | (2023.01) |
| *H10K 59/12* | (2023.01) |
| *H10K 71/00* | (2023.01) |
| *H10K 102/00* | (2023.01) |

(58) Field of Classification Search
USPC .......................................................... 257/40
See application file for complete search history.

(56) References Cited

U.S. PATENT DOCUMENTS

| | | | | |
|---|---|---|---|---|
| 2011/0193107 | A1 | 8/2011 | Takeuchi et al. | |
| 2013/0187163 | A1 | 7/2013 | Kim et al. | |
| 2015/0060820 | A1* | 3/2015 | Takagi | H10K 59/80518 438/46 |
| 2017/0125740 | A1 | 5/2017 | Lee et al. | |
| 2017/0148860 | A1* | 5/2017 | Park | H10K 59/122 |
| 2017/0271421 | A1* | 9/2017 | Jinbo | H10K 59/124 |
| 2018/0151830 | A1 | 5/2018 | Furuta et al. | |
| 2018/0211979 | A1 | 7/2018 | Lee et al. | |
| 2018/0277612 | A1 | 9/2018 | Kim et al. | |
| 2019/0006435 | A1 | 1/2019 | Chen et al. | |
| 2019/0131563 | A1 | 5/2019 | Liu et al. | |
| 2019/0386248 | A1* | 12/2019 | Itonaga | H10K 59/122 |
| 2019/0393285 | A1* | 12/2019 | Kato | H05B 33/02 |
| 2020/0035951 | A1 | 1/2020 | Cheon et al. | |
| 2020/0144535 | A1 | 5/2020 | Kim | |
| 2020/0194711 | A1 | 6/2020 | Kim et al. | |
| 2020/0194713 | A1 | 6/2020 | Kim et al. | |
| 2020/0219951 | A1 | 7/2020 | Ukigaya | |

FOREIGN PATENT DOCUMENTS

| | | | |
|---|---|---|---|
| CN | 104425766 | A | 3/2015 |
| CN | 105977396 | A | 9/2016 |
| CN | 106653800 | A | 5/2017 |
| CN | 107863449 | A | 3/2018 |
| CN | 108123064 | A | 6/2018 |
| CN | 108346681 | A | 7/2018 |
| CN | 109742122 | A | 5/2019 |
| CN | 110235520 | A | 9/2019 |
| CN | 110459700 | A | 11/2019 |
| CN | 111326550 | A | 6/2020 |
| CN | 111326670 | A | 6/2020 |
| CN | 112002827 | A | 11/2020 |

OTHER PUBLICATIONS

CN202010917074.7 second office action.
CN202010917074.7 third office action.
CN202210423798.5 First office action dated Jun. 25, 2026.

* cited by examiner

DISPLAY PANEL AND MANUFACTURING METHOD THEREFOR, AND DISPLAY DEVICE

CROSS-REFERENCE TO RELATED APPLICATION

This application is a U.S. national phase application based on PCT/CN2021/110862, filed on Aug. 5, 2021, which claims priority to Chinese Patent Application No. 202010917074.7, filed on Sep. 3, 2020 and entitled "DISPLAY PANEL AND MANUFACTURING METHOD THEREFOR, AND DISPLAY DEVICE", the disclosures of which are herein incorporated by reference in their entireties.

TECHNICAL FIELD

The present disclosure relates to the field of display technologies, and in particular relates to a display panel and a manufacturing method therefor, and a display device.

BACKGROUND

Organic light-emitting diode (OLED) display panels have been widely used for their advantages of self-luminescence, low drive voltage, fast response speed and the like.

SUMMARY

The present disclosure provides a display panel, a manufacturing method therefor, and a display device. The technical solutions are as follows.

In a First Aspect, a Display Panel is Provided. The Display Panel Includes:

- a base substrate; and
- a plurality of sub-pixels disposed on a side of the base substrate, each of the sub-pixels including: a first electrode, a light-emitting film layer, and a second electrode laminated in sequence along a direction going away from the base substrate, wherein the first electrode includes a first portion and a second portion surrounding the first portion, a thickness of the second portion being greater than a thickness of the first portion.

In some embodiments, the display panel further includes: a planarization layer;

- wherein the planarization layer is disposed between the base substrate and the first electrode, and a surface of the first electrode close to the base substrate is a flat surface.

In some embodiments, the display panel further includes: a protective layer;

- wherein the protective layer covers the second portion, to insulate the second portion from the light-emitting film layer.

In some embodiments, the protective layer includes: a middle portion and an edge portion connected to the middle portion;

- wherein an orthographic projection of the edge portion on the base substrate covers an orthographic projection of the second portion on the base substrate, and an orthographic projection of the middle portion on the base substrate covers a gap between the first electrodes of two adjacent sub-pixels.

In some embodiments, a distance between the middle portion and the base substrate is smaller than a distance between the edge portion and the base substrate.

In some embodiments, the protective layer is made from an inorganic material.

In some embodiments, the protective layer has a thickness less than 20 nm.

In some embodiments, the thickness of the second portion is 1.1 times to 1.5 times the thickness of the first portion.

In some embodiments, the thickness of the first portion ranges from 50 nm to 1200 nm.

In some embodiments, the light-emitting film layer includes: a first light-emitting material layer and a second light-emitting material layer laminated in sequence along the direction going away from the base substrate;

- wherein light emitted from the first light-emitting material layer and light emitted from the second light-emitting material layer is mixed into white light.

In some embodiments, the display panel further includes: a color filter layer disposed on a side, away from the base substrate, of the plurality of sub-pixels;

- wherein the color filter layer includes a plurality of color resistance blocks of different colors, and an orthographic projection of each of the sub-pixels on the base substrate is within an orthographic projection of one of the color resistance blocks on the base substrate.

In some embodiments, a sidewall of the second portion is perpendicular to a bearing surface of the base substrate, and the light-emitting film layer does not cover the sidewall.

In some embodiments, the display panel further includes: an organic functional layer disposed between the first electrode and the second electrode;

- wherein a sidewall of the second portion is perpendicular to a bearing surface of the base substrate, and the organic functional layer does not cover the sidewall.

In some embodiments, each of the sub-pixels further includes: a transistor connected to the first electrode.

In some embodiments, the first electrode is made of a non-light-transmitting metal material.

In some embodiments, the non-light-transmitting metal material includes one of aluminum, titanium, and molybdenum.

In some embodiments, the display panel is a silicon-based organic light-emitting diode display panel.

In a second aspect, a method for manufacturing a display panel is provided. The method includes:

- providing a base substrate; and
- forming a plurality of sub-pixels on a side of the base substrate. Each of the sub-pixels includes: a first electrode, a light-emitting film layer, and a second electrode laminated in sequence along a direction away from the base substrate;
- wherein the first electrode includes: a first portion and a second portion surrounding the first portion, and a thickness of the second portion is greater than a thickness of the first portion.

In a third aspect, a display device is provided. The display device includes: a drive circuit and the display panel according to the above first aspect.

The drive circuit is connected to a plurality of sub-pixels in the display panel and is configured to provide a drive signal for each of the sub-pixels.

BRIEF DESCRIPTION OF THE DRAWINGS

To describe the technical solutions in the embodiments of the present disclosure more clearly, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

DETAILED DESCRIPTION

For clearer descriptions of the objectives, technical solutions, and advantages of the present disclosure, the embodiments of the present disclosure are described in detail hereinafter with reference to the accompanying drawings.

In the related art, an OLED display panel may include a plurality of OLED sub-pixels of different colors. Each of the OLED sub-pixels includes an anode layer, a cathode layer, and a light-emitting layer disposed between the anode layer and the cathode layer. The light-emitting layer can emit light under the drive of the anode layer and the cathode layer.

However, due to the close distance between the plurality of OLED sub-pixels, light emitted from the light-emitting layer in an OLED sub-pixel may be exited from the cathode layer of an OLED sub-pixel adjacent to the OLED sub-pixel, and light emitted from the plurality of OLED sub-pixels may have crosstalk, which affects the display effect of the display device.

Silicon-based OLED display panels are widely used in virtual reality (VR) devices, augmented reality devices, camera viewfinders or sights for the ultra-high pixels per inch (PPI).

However, due to the small size of the sub-pixels in the silicon-based OLED display panel, the accuracy of manufacturing the light-emitting layer of the sub-pixel by using a mask is low. Therefore, in general, the display panel may be prepared by using a white light OLED and a color filter layer. That is, light emitted from each sub-pixel in the display panel is white light, and the white light forms light of various colors after passing through the color filter layer in the display panel.

Figure 1:
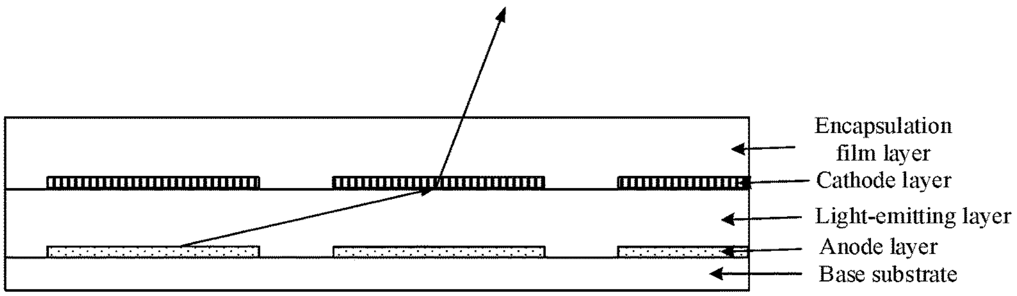
FIG. 1 (Related Art)
FIG. 1 is a schematic structural diagram of a display panel in the related art.

Referring to FIG. 1, the display panel includes a base substrate, a plurality of sub-pixels (three sub-pixels are shown in FIG. 1), and an encapsulation film layer. Each of the sub-pixels includes: an anode layer, a light-emitting layer, and a cathode layer laminated in sequence along a direction going away from the base substrate. Since some of the light rays emitted from the light-emitting layer of a sub-pixel have a big angle, these light rays may be emitted from the cathode layer of a sub-pixel adjacent to the sub-pixel, resulting in crosstalk of the light rays from the plurality of sub-pixels. Therefore, the display device has a poor display effect.

Figure 2:
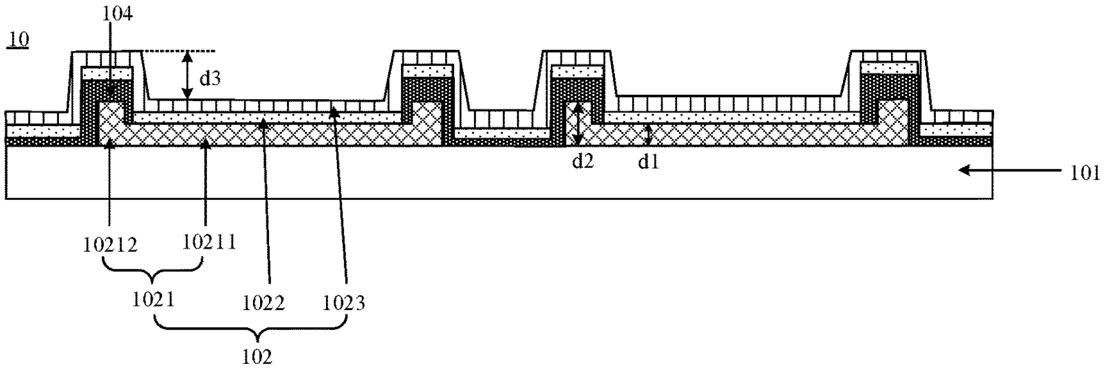
FIG. 2 is a schematic structural diagram of a display panel according to an embodiment of the present disclosure.

An embodiment of the present disclosure provides a display panel, which can solve the problem of poor display effect of the display device caused by light crosstalk of a plurality of sub-pixels 102 in the related art. Referring to FIG. 2, the display panel 10 may include a base substrate 101 and a plurality of sub-pixels 102 disposed on a side of the base substrate 101.

Each of the sub-pixels 102 may include a first electrode (anode) 1021, a light-emitting film layer 1022, and a second electrode (cathode) 1023 laminated in sequence along a direction going away from the base substrate 101. The light-emitting film layer 1022 may emit light under the drive of the first electrode 1021 and the second electrode 1023. The first electrode 1021 may include a first portion 10211 and a second portion 10212 surrounding the first portion 10211. The thickness of the second portion 10212 may be greater than the thickness of the first portion 10211.

In some embodiments, the first electrode 1021 may be an anode, and the second electrode 1023 may be a cathode.

In summary, the embodiment of the present disclosure provides a display panel. In the display panel, the thickness of the second portion of the first electrode of the sub-pixel may be relatively large, which can prevent light emitted from the portion, disposed on the first portion of the first electrode, of the light-emitting film layer from transmitting to the region where the adjacent sub-pixel is disposed, thereby preventing the light emitted from the light-emitting film layer in the sub-pixel from being exited from the second electrode of the adjacent sub-pixel. Therefore, crosstalk of light emitted from the plurality of sub-pixels is avoided, and the display effect of the display device is better.

In the embodiment of the present disclosure, the first electrode 1021 may be made from a non-light-transmitting metal material to ensure that the second portion 10212 of the first electrode 1021 can effectively reflect light so as to prevent the light from transmitting to the second electrode 1023 of the adjacent sub-pixel 102. In some embodiments, the non-light-transmitting metal material may include one of aluminum (Al), titanium (Ti), and molybdenum (Mo).

In addition, the first portion 10211 and the second portion 10212 of the first electrode 1021 may be of an integral structure, and for example may be prepared by the same patterning process.

Figure 3:
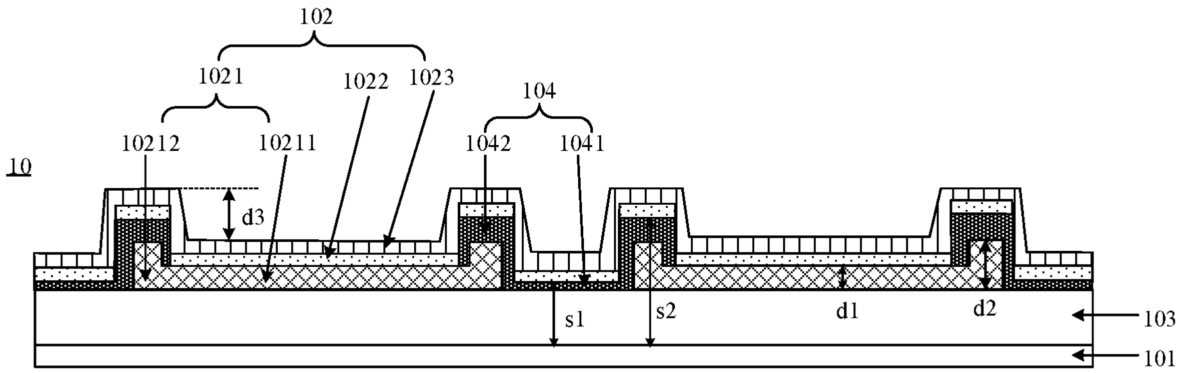
FIG. 3 is a schematic structural diagram of another display panel according to an embodiment of the present disclosure.

FIG. 3 is a schematic structural diagram of another display panel according to an embodiment of the present disclosure. Referring to FIG. 3, the display panel 10 may further include a planarization layer 103. The planarization layer 103 may be disposed between the base substrate 101 and the first electrode 1021. That is, the planarization layer 103 may be disposed on a side of the base substrate 101, and the first electrode 1021 may be disposed on the side, away from the base substrate 101, of the planarization layer 103. The surface, close to the base substrate 101, of the first electrode 1021 is a flat surface.

In some embodiments, the planarization layer 103 may be made of an inorganic material. For example, the planarization layer 103 may be made of one or more of SiN (silicon nitride), SiO (silicon oxide), and SiON (silicon oxynitride).

Referring to FIG. 2 and FIG. 3, it can be seen that the display panel 10 may further include a protective layer 104. The protective layer 104 may be disposed on the side, away from the base substrate 101, of the second portion 10212 of the first electrode 1021. The protective layer 104 may cover the second portion 10212 to insulate the second portion 10212 from the light-emitting film layer 1022. Therefore, the light emitted from the portion, disposed on the second portion 10212, of the light-emitting film layer 1022 and the light emitted from the adjacent sub-pixel can be prevented from crosstalk with each other. Since the thickness of the second portion 10212 is relatively large, the second portion 10212 can also prevent the light emitted from the portion, disposed on the first portion 10211, of the light-emitting film layer 1022 from transmitting to the region where the adjacent sub-pixel is disposed.

In addition, by covering the second portion 10212 with the protective layer 104, the second electrode 1023 formed on the second portion 10212 can be prevented from being in direct contact with the first electrode 1021, that is, a short circuit between the second electrode 1023 and the first electrode 1021 can be avoided, which ensures the normal display of the display panel 10.

Referring to FIG. 2 and FIG. 3, an orthographic projection of the protective layer 104 on the base substrate 101 is only partially overlapped with an orthographic projection of the first portion 10211 on the base substrate 101. Therefore, it can be ensured that the light-emitting film layer 1022 formed on a side of the first portion 10211 may be in contact with the first portion 10211, to ensure that the light-emitting film layer 1022 can emit light under the drive of the first portion 10211 of the first electrode 1021 and the second electrode 1023.

Referring to FIG. 3, the protective layer 104 may include a middle portion 1041 and an edge portion 1042 connected to the middle portion 1041. An orthographic projection of the edge portion 1042 on the base substrate 101 may cover an orthographic projection of the second portion 10212 on the base substrate 101. An orthographic projection of the middle portion 1041 on the base substrate 101 may cover a gap between the first electrodes 1021 of two adjacent sub-pixels 102.

Referring to FIG. 3, a distance s1 between the middle portion 1041 and the base substrate 101 may be smaller than a distance s2 between the edge portion 1042 and the base substrate 101.

In some embodiments, the protective layer 104 may be made of an inorganic material. For example, the protective layer 104 may be made of one or more of SiN, SiO, and SiON. In addition, the protective layer 104 may have a thickness less than 20 nm. The thickness of the protective layer 104 is relatively small, which can prevent a distance d3 between the portion, disposed on a side of the protective layer 104, of the second electrode 1023 and the portion, disposed on a side of the first portion 10211 not covered by the protective layer 104, of the second electrode 1023 from being too large in a direction perpendicular to the bearing surface of the base substrate 101. Thus, the second electrode 1023 can be prevented from breaking, which can ensure the normal display of the display panel 10.

In the embodiment of the present disclosure, the thickness d2 of the second portion 10212 may be 1.1 times to 1.5 times the thickness d1 of the first portion 10211. For example, the difference between the thickness d2 of the second portion 10212 and the thickness d1 of the first portion 10211 may range from 20 nm to 50 nm. Since the difference between the thickness d2 of the second portion 10212 and the thickness d1 of the first portion 10211 is small, the second electrode 1023 subsequently formed on the side of the first electrode 1021 away from the base substrate 101 can be prevented from breaking, thereby ensuring the normal display of the display panel 10. In some embodiments, the thickness of the first portion 10211 may range from 50 nm to 1200 nm.

The thickness d1 of the first portion 10211 is a length of the first portion 10211 in the direction perpendicular to the bearing surface of the base substrate 101. The thickness d2 of the second portion 10212 is a length of the second portion 10212 in the direction perpendicular to the bearing surface of the base substrate 101.

In some embodiments, a first electrode film layer may be formed on the base substrate 101 first, and then the first electrode film layer is etched by a dry etching process to acquire the first electrode 1021. The thickness of the second portion 10212 may be equal to the thickness of the first electrode film layer.

Figure 4:
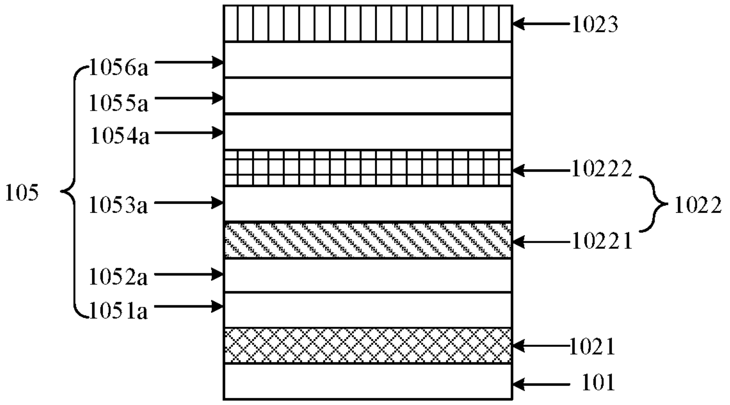
FIG. 4 is a schematic diagram of layers of a display panel according to an embodiment of the present disclosure.

FIG. 4 is a schematic diagram of layers of a display panel according to an embodiment of the present disclosure. Referring to FIG. 4, the light-emitting film layer 1022 may include a first light-emitting material layer 10221 and a second light-emitting material layer 10222 laminated in sequence along a direction away from the base substrate 101.

Light emitted from the first light-emitting material layer 10221 and light emitted from the second light-emitting material layer 10222 may be mixed into white light. For example, the first light-emitting material layer 10221 may be made of a yellow phosphorescent material, and the color of the light emitted from the first light-emitting material layer 10221 may be yellow. The second light-emitting material layer 10222 may be made of a blue fluorescent material, and the color of the light emitted from the second light-emitting material layer 10222 may be blue.

Figure 5:
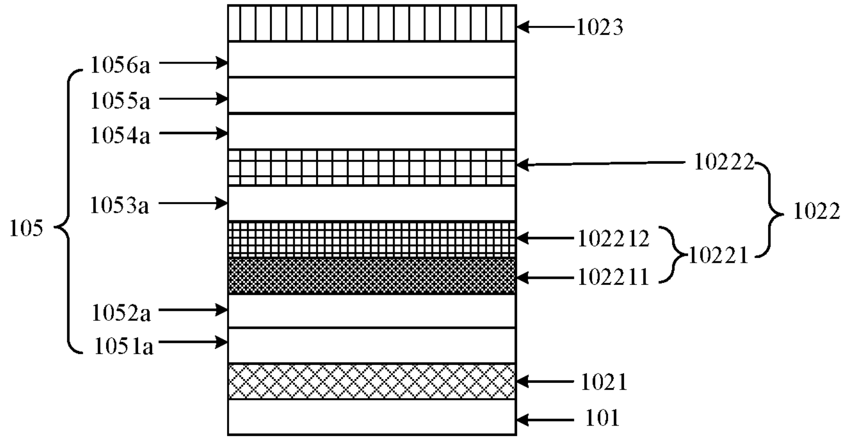
FIG. 5 is a schematic diagram of layers of another display panel according to an embodiment of the present disclosure.

FIG. 5 is a schematic diagram of layers of another display panel according to an embodiment of the present disclosure. Referring to FIG. 5, the first light-emitting material layer 10221 may include a first sub-layer 102211 and a second sub-layer 102212 laminated in sequence along a direction away from the base substrate 101. The first sub-layer 102211 may be made of a red phosphorescent material, and the color of the light emitted from the first sub-layer 102211 may be red. The second sub-layer 102212 may be made of a green phosphorescent material, and the color of the light emitted from the second sub-layer 102212 may be green. The light emitted from the first sub-layer 102211 and the light emitted from the second sub-layer 102212 may be mixed into yellow light.

Referring to FIG. 4 and FIG. 5, the display panel 10 may further include an organic functional layer 105. The organic functional layer 105 includes a hole injection layer (HIL) 1051*a*, a hole transport layer (HTL) 1052*a*, an interlayer 1053*a*, a hole block layer (HBL) 1054*a*, an electron transport layer (ETL) 1055*a*, and an electron injection layer (EIL) 1056*a*.

The first electrode 1021, the hole injection layer 1051*a*, the hole transport layer 1052*a*, the first light-emitting material layer 10221, the interlayer 1053*a*, the second light-emitting material layer 10222, the hole block layer 1054*a*, the electron transport layer 1055*a*, the electron injection layer 1056*a*, and the second electrode 1023 are laminated in sequence along the direction away from the base substrate 101.

Figure 6:
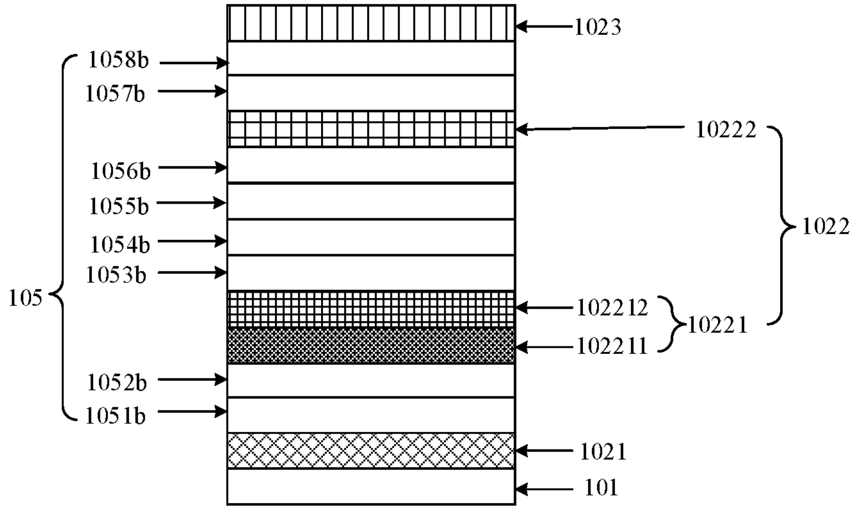
FIG. 6 is a schematic diagram of layers of still another display panel according to an embodiment of the present disclosure.

FIG. 6 is a schematic diagram of layers of still another display panel according to an embodiment of the present disclosure. Referring to FIG. 6, the organic functional layer 105 includes a first hole injection layer 1051*b*, a first hole transport layer 1052*b*, a first electron transport layer 1053*b*, a charge generation layer (CGL) 1054*b*, a second hole injection layer 1055*b*, a second hole transport layer 1056*b*, a second electron transport layer 1057*b*, and an electron injection layer 1058*b*.

The first electrode 1021, the first hole injection layer 1051*b*, the first hole transport layer 1052*b*, the first sub-layer 102211, the second sub-layer 102212, the first electron transport layer 1053*b*, the charge generation layer 1054*b*, the second hole injection layer 1055*b*, the second hole transport layer 1056*b*, the second light-emitting material layer 10222, the second electron transport layer 1057*b*, the electron injection layer 1058*b*, and the second electrode 1023 are laminated in sequence along the direction away from the base substrate 101.

It should be noted that FIGS. 4 to 6 merely illustrate the relationship of various layers in the display panel 10, and do not show the specific structure of the first electrode 1021, that is, the first portion 10211 and the second portion 10212 of the first electrode 1021 are not shown.

Figure 7:
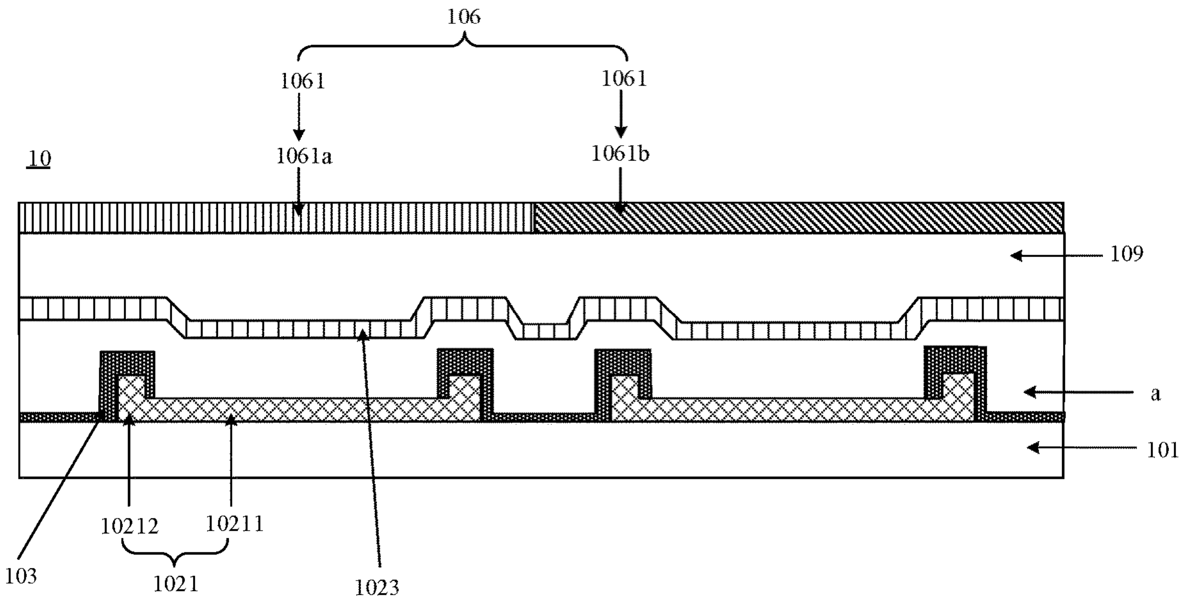
FIG. 7 is a schematic structural diagram of still another display panel according to an embodiment of the present disclosure.

FIG. 7 is a schematic structural diagram of still another display panel according to an embodiment of the present disclosure. Referring to FIG. 7, the display panel 10 may further include a color filter layer 106. The color filter layer 106 may be disposed on a side, away from the base substrate 101, of the plurality of sub-pixels 102. The color filter layer 106 may include a plurality of color resistance blocks 1061 of different colors. An orthographic projection of each sub-pixel 102 on the base substrate 101 is within an orthographic projection of one color resistance block 1061 on the base substrate 101.

The film layer a shown in FIG. 7 may include the organic functional layer 105 and the light-emitting film layer 1022 between the first electrode 1021 and the second electrode 1023 in any of the drawings in FIG. 4 to FIG. 6.

In an example embodiment, FIG. 7 shows two sub-pixels 102 and two color resistance blocks 1061. The color of a first color resistance block 1061*a* may be red (R), and the color of a second color resistance block 1061*b* may be green (G).

Since the light emitted from the sub-pixels 102 in the display panel 10 according to the embodiment of the present disclosure is white light, by disposing the color filter layer 106 on the side of the sub-pixels 102 away from the base substrate 101, light of various colors may be emitted after the white light is transmitted through the color resistance blocks of different colors in the color filter layer 106, and the color gamut of the display panel 10 is relatively high.

Figure 8:
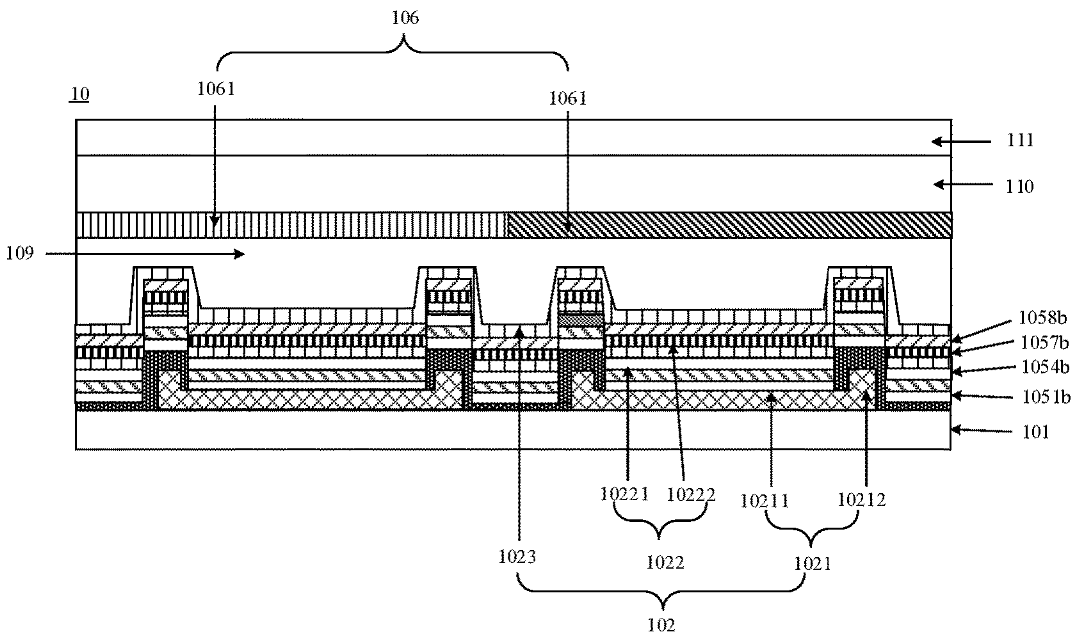
FIG. 8 is a schematic structural diagram of still yet another display panel according to an embodiment of the present disclosure.

FIG. 8 is a schematic structural diagram of yet another display panel according to an embodiment of the present disclosure. Referring to FIG. 8, a sidewall of the second portion 10212 may be perpendicular to the bearing surface of the base substrate 101, and the light-emitting film layer 1022 does not cover the sidewall. That is, the light-emitting film layer 1022 is broken at the sidewall, and the light-emitting film layers 1022 of adjacent sub-pixels 102 are not connected.

Since the light-emitting film layers 1022 of adjacent sub-pixels 102 are not connected, mutual influence between adjacent sub-pixels 102 can be avoided, which can ensure the display effect of the display device.

Referring to FIG. 8, it may also be seen that the organic functional layer 105 does not cover the sidewall of the second portion 10212 either. That is, the organic functional layers 105 of adjacent sub-pixels 102 are not connected. For example, the hole injection layer 1051*a*, the hole transport layer 1052*a*, the electron transport layer 1055*a*, and the electron injection layer 1056*a* are all broken at the sidewall, which can prevent holes or electrons from being transported between adjacent sub-pixels 102, thereby avoiding electrical crosstalk. Therefore, the yield of the display panel 10 is relatively high.

Figure 9:
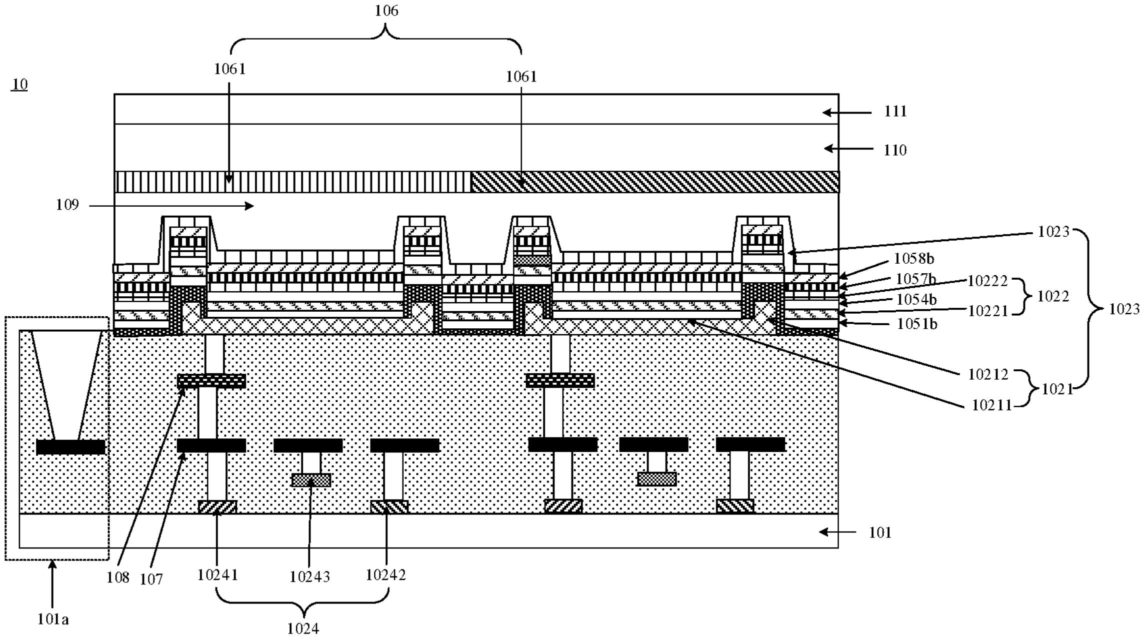
FIG. 9 is a schematic structural diagram of still yet another display panel according to an embodiment of the present disclosure.

FIG. 9 is a schematic structural diagram of yet another display panel according to an embodiment of the present disclosure. Referring to FIG. 9, each of the sub-pixels 102 may further include a transistor 1024. The transistor 1024 may be connected to the first electrode 1021. Two sub-pixels 102 are shown in FIG. 9, and two transistors 1024 are correspondingly shown.

Referring to FIG. 9, the transistor 1024 may include a source (S) 10241, a drain (D) 10242, and a gate (G) 10243. Additionally, the display panel 10 may further include a first metal layer 107 and a second metal layer 108. The source 10241 may be connected to a metal pattern of the first metal layer 107 through a via hole, the metal pattern of the first metal layer 107 may be connected to a metal pattern of the second metal layer 108 through a via hole, and the metal pattern of the second metal layer 108 may be connected to the first electrode 1021 through a via hole. The drain 10242 may be connected to a metal pattern of the first metal layer 107 through a via hole. The gate 10243 may be connected to a metal pattern of the first metal layer 107 through a via hole. The metal patterns of the first metal layer 107 connected to the source 10241, the drain 10242, and the gate 10243 are different.

In this embodiment of the present disclosure, the display panel 10 may be a silicon-based OLED display panel. The transistor 1024 in the silicon-based OLED display panel is a transistor made from single crystal silicon.

Referring to FIG. 8 and FIG. 9, the display panel 10 may further include a first encapsulation film layer 109, a second encapsulation film layer 110, and a cover plate 111.

The first encapsulation film layer 109 may be disposed on the side of the second electrode 1023 away from the base substrate 101. The second encapsulation film layer 110 may be disposed on the side of the color filter layer 106 away from the base substrate 101. The cover plate 111 may be disposed on the side of the second encapsulation film layer 110 away from the base substrate 101.

The first encapsulation film layer 109 and the second encapsulation film layer 110 may be prepared by chemical vapor deposition (CVD), ink jet printing (IJP), or other manufacturing processes.

In some embodiments, the first encapsulation film layer 109 and the second encapsulation film layer 110 each may include an inorganic film layer and an organic film layer. The inorganic film layer may be made from an inorganic material, for example, one of SiO, SiN, SiON or $Al_2O_3$ (aluminum oxide). The organic film layer may be made from an organic material, for example, an acrylic material.

Referring to FIG. 9, the base substrate 101 may be provided with a bonding region 101*a*, and the first metal layer 107 may be disposed in the bonding region 101*a*, such that a drive circuit is connected to the first metal layer 107 through a via hole.

In summary, the embodiment of the present disclosure provides a display panel. In the display panel, the thickness of the second portion of the first electrode of the sub-pixel may be relatively large, which can prevent light emitted from the portion, disposed on the first portion of the first electrode, of the light-emitting film layer from transmitting to the region where the adjacent sub-pixel is disposed, thereby preventing the light emitted from the light-emitting film layer in the sub-pixel from being exited from the second electrode of the adjacent sub-pixel. Therefore, crosstalk of light emitted from the plurality of sub-pixels is avoided, and the display effect of the display device is better. In addition, since the risk of crosstalk between adjacent sub-pixels in the display panel provided by the embodiment of the present disclosure is low, the color gamut of the display panel is high, and display defects such as striped patterns will not occur.

Figure 10:
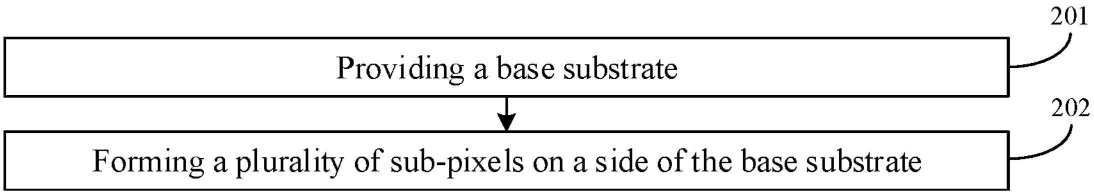
FIG. 10 is a flowchart of a method for manufacturing a display panel according to an embodiment of the present disclosure.

FIG. 10 is a flowchart of a method for manufacturing a display panel according to an embodiment of the present disclosure. This method may be applied to manufacture the display panel 10 according to the above embodiments. For example, the manufacture of the display panel shown in FIG. 2 is taken as an example for illustration, referring to FIG. 10, the method may include the following steps.

In step 201, a base substrate is provided.

In the embodiment of the present disclosure, when the display panel 10 is manufactured, a base substrate may be provided first. The base substrate may be a glass substrate.

In step 202, a plurality of sub-pixels are formed on a side of the base substrate.

In this embodiment of the present disclosure, each of the sub-pixels 102 may include a first electrode 1021, a light-emitting film layer 1022, and a second electrode 1023 laminated in sequence along a direction going away from the base substrate 101. The light-emitting film layer 1022 may emit light under the drive of the first electrode 1021 and the second electrode 1023. The first electrode 1021 may include a first portion 10211 and a second portion 10212 surrounding the first portion 10211. The thickness of the second portion 10212 may be greater than the thickness of the first portion 10211.

In summary, the embodiment of the present disclosure provides a method for manufacturing a display panel. In the display panel prepared by the method, the thickness of the second portion of the first electrode of the sub-pixel may be relatively large, which can prevent light emitted from the portion, disposed on the first portion, of the light-emitting film layer from transmitting to the region where the adjacent sub-pixel is disposed, thereby preventing the light emitted from the light-emitting film layer in the sub-pixel from being exited from the second electrode of the adjacent sub-pixel. Therefore, crosstalk of light emitted from the plurality of sub-pixels is avoided, and the display effect of the display device is better.

Figure 11:
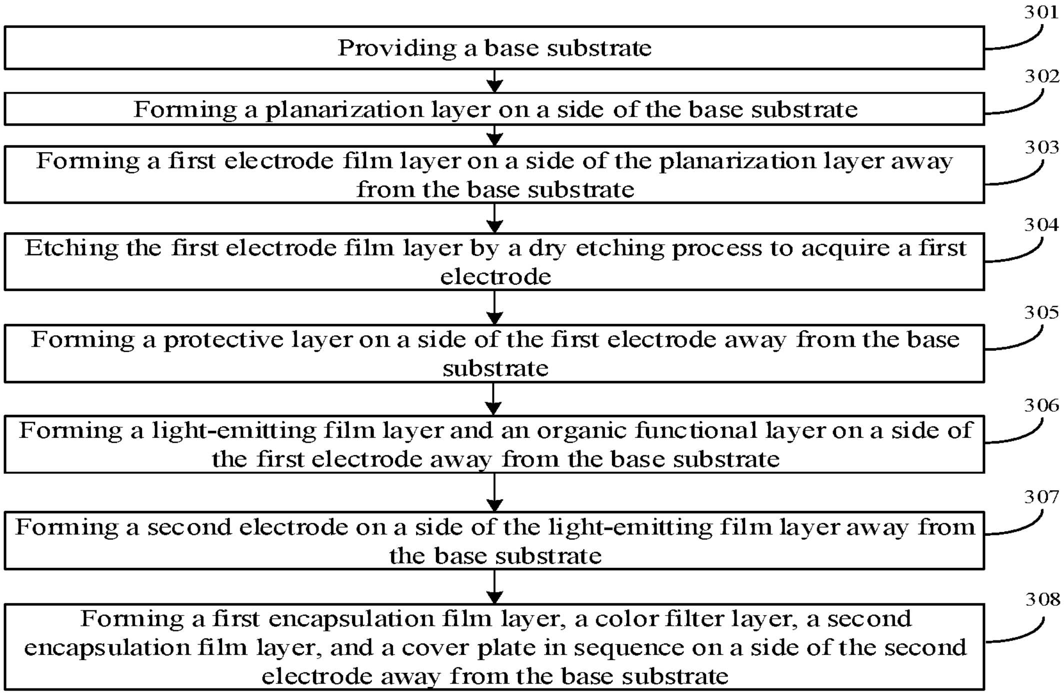
FIG. 11 is a flowchart of another method for manufacturing a display panel according to an embodiment of the present disclosure.

FIG. 11 is a flowchart of a method for manufacturing a display panel according to an embodiment of the present disclosure. This method may be applied to manufacture the display panel 10 according to the above embodiments. With reference to FIG. 11, the method may include the following steps.

In step 2, a base substrate is provided.

In the embodiment of the present disclosure, when the display panel 10 is manufactured, a base substrate may be provided first. The base substrate may be a glass substrate.

In step 302, a planarization layer is formed on a side of the base substrate.

In the embodiment of the present disclosure, the planarization layer 103 may be formed on a side of the base substrate 101 first, such that the first electrode 1021 is subsequently formed on the side of the planarization layer 103 away from the base substrate 101. A surface of the first electrode 1021 close to the base substrate 101 is a flat surface.

In step 303, a first electrode film layer is formed on a side of the planarization layer away from the base substrate.

Figure 12:
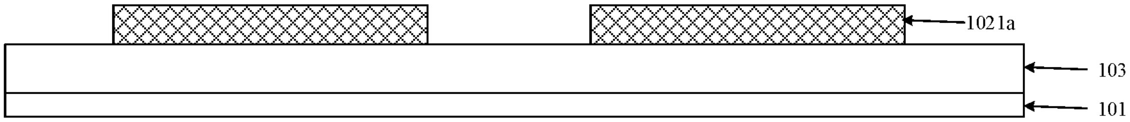
FIG. 12 is a schematic diagram of forming a first electrode film layer according to an embodiment of the present disclosure.

In this embodiment of the present disclosure, referring to FIG. 12, the first electrode film layer 1021*a* may be formed on the side of the planarization layer 103 away from the base substrate 101. The material of the first electrode film layer 1021*a* may be a non-light-transmitting metal material, for example, one of Al, Ti, and Mo.

In step 304, the first electrode film layer is etched by a dry etching process to acquire a first electrode.

Figure 13:
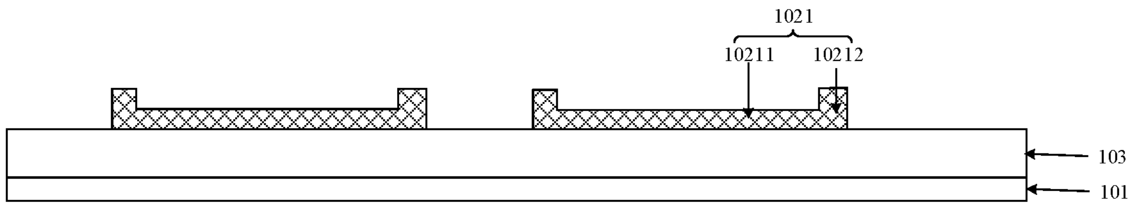
FIG. 13 is a schematic diagram of forming a first electrode according to an embodiment of the present disclosure.

In the embodiment of the present disclosure, referring to FIG. 13, the first electrode film layer 1021*a* is etched by a dry etching process to acquire the first electrode 1021. The first electrode 1021 may include a first portion 10211 and a second portion 10212 surrounding the first portion 10211. The thickness of the second portion 10212 may be greater than the thickness of the first portion 10211. Moreover, the thickness of the second portion 10212 may be equal to the thickness of the first electrode film layer 1021*a*.

In step 305, a protective layer is formed on a side of the first electrode away from the base substrate.

Figure 14:
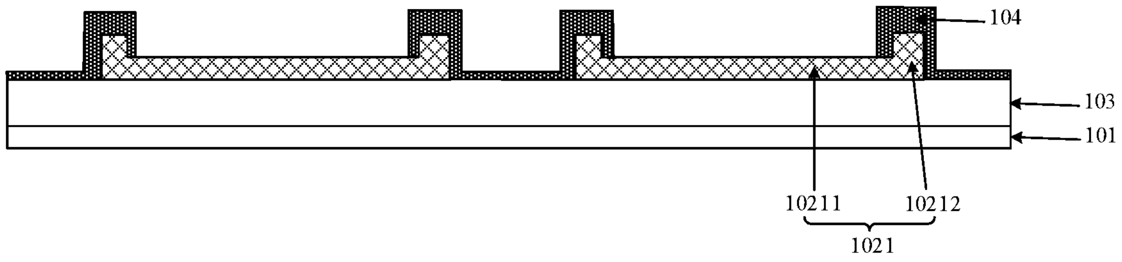
FIG. 14 is a schematic diagram of forming a protective layer according to an embodiment of the present disclosure.

In this embodiment of the present disclosure, referring to FIG. 14, after the first electrode 1021 is acquired, the protective layer 104 may be formed on the side of the first electrode 1021 away from the base substrate 101. The protective layer 104 may cover the second portion 10212 to insulate the second portion 10212 from the light-emitting film layer 1022.

By covering the second portion 10212 with the protective layer 104, the second electrode 1023 formed subsequently may be prevented from being in direct contact with the first electrode 1021, that is, a short circuit between the second electrode 1023 and the first electrode 1021 may be avoided, which can ensure the normal display of the display panel 10.

In addition, an orthographic projection of the protective layer 104 on the base substrate 101 is only partially overlapped with an orthographic projection of the first portion 10211 on the base substrate 101, such that it's ensured that the light-emitting film layer 1022 formed on a side of the first portion 10211 may be in contact with the first portion 10211. Therefore, it can be ensured that the light-emitting film layer 1022 can emit light under the drive of the first portion 10211 of the first electrode 1021 and the second electrode 1023.

In step 306, a light-emitting film layer and an organic functional layer are formed on a side of the first electrode away from the base substrate.

Figure 15:
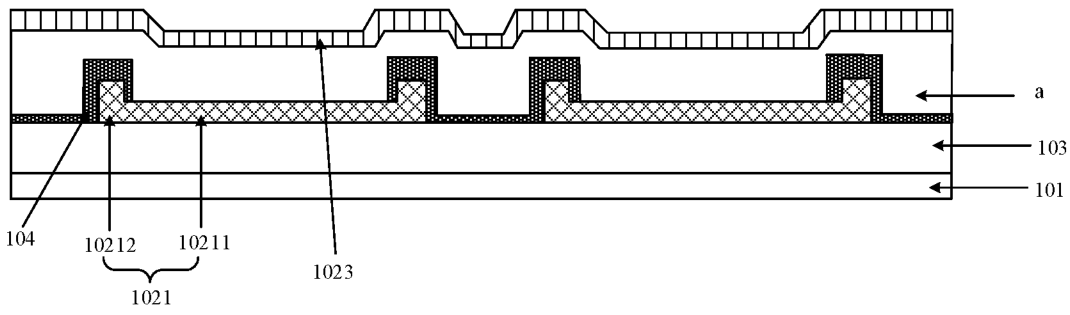
FIG. 15 is a schematic diagram of forming a light-emitting film layer, an organic functional layer, and a second electrode according to an embodiment of the present disclosure.

In this embodiment of the present disclosure, referring to FIG. 15, a film layer a is formed on a side of the first electrode 1021 away from the base substrate 101, and the film layer a includes a light-emitting film layer and an organic functional layer.

By taking the schematic diagrams of layers of the display panels shown in FIG. 4 and FIG. 5 as an example, the hole injection layer 1051*a*, the hole transport layer 1052*a*, the first light-emitting material layer 10221, the interlayer 1053*a*, the second light-emitting material layer 10222, the hole block layer 1054*a*, the electron transport layer 1055*a*, and the electron injection layer 1056*a* may be formed in sequence on a side of the first electrode 1021 away from the base substrate 101 by an evaporation process.

By taking the schematic diagram of layers of the display panel shown in FIG. 6 as an example, the first hole injection layer 1051*b*, the first hole transport layer 1052*b*, the first sub-layer 102211, the second sub-layer 102212, the first electron transport layer 1053*b*, the charge generation layer 1054*b*, the second hole injection layer 1055*b*, the second hole transport layer 1056*b*, the second light-emitting material layer 10222, the second electron transport layer 1057*b*, and the electron injection layer 1058*b* may be formed in sequence on a side of the first electrode 1021 away from the base substrate 101 by an evaporation process.

In the embodiments of the present disclosure, both the light-emitting film layer and the organic functional layer may be prepared by using an open mask.

In step 307, a second electrode is formed on a side of the light-emitting film layer away from the base substrate.

Referring to FIG. 15, the second electrode 1023 may be formed on the side of the light-emitting film layer away from the base substrate.

In step 308, a first encapsulation film layer, a color filter layer, a second encapsulation film layer, and a cover plate may be formed in sequence on a side of the second electrode away from the base substrate.

Figure 16:
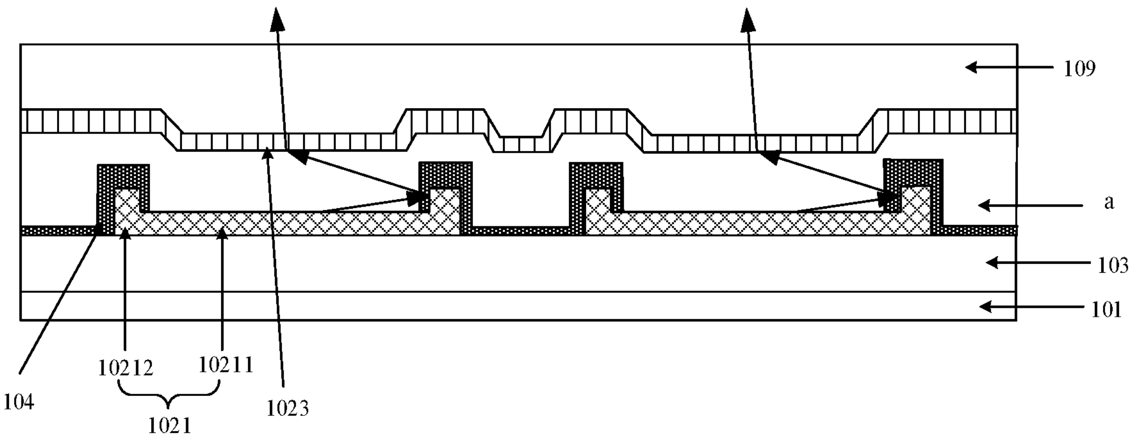
FIG. 16 is a schematic diagram of forming a first encapsulation film layer according to an embodiment of the present disclosure.

In the embodiment of the present disclosure, referring to FIG. 16, the first encapsulation film layer 109 may be formed on the side of the second electrode 1023 away from the base substrate 101 by CVD, IJP or other manufacturing processes.

Afterwards, referring to FIG. 8, the color filter layer 106 may be formed on a side of the first encapsulation film layer 109 away from the base substrate 101. Then, the second encapsulation film layer 110 may be formed on a side of the color filter layer 106 away from the base substrate 101 by CVD, IJP or other manufacturing processes. Finally, the cover plate 111 may be formed on a side of the second encapsulation film layer 110 away from the base substrate 101.

Referring to FIG. 16, light emitted from the sub-pixel 102 may be irradiated onto the sidewall of the second portion 10212 of the sub-pixel 102, and the sidewall of the second portion 10212 may reflect the light to the second electrode 1023 of the sub-pixel 102 and the light is exited from the second electrode 1023 of the sub-pixel 102. Therefore, the risk of light crosstalk can be reduced, which can ensure the display effect of the display device.

In summary, the embodiment of the present disclosure provides a method for manufacturing a display panel. In the display panel manufactured by the method, the thickness of the second portion of the first electrode of the sub-pixel may be relatively large, which can prevent light emitted from the portion, disposed on the first portion of the first electrode, of the light-emitting film layer from transmitting to the region where the adjacent sub-pixel is disposed, thereby preventing the light emitted from the light-emitting film layer in the sub-pixel from being exited from the second electrode of the adjacent sub-pixel. Therefore, crosstalk of light emitted from the plurality of sub-pixels is avoided, and the display effect of the display device is better.

Figure 17:
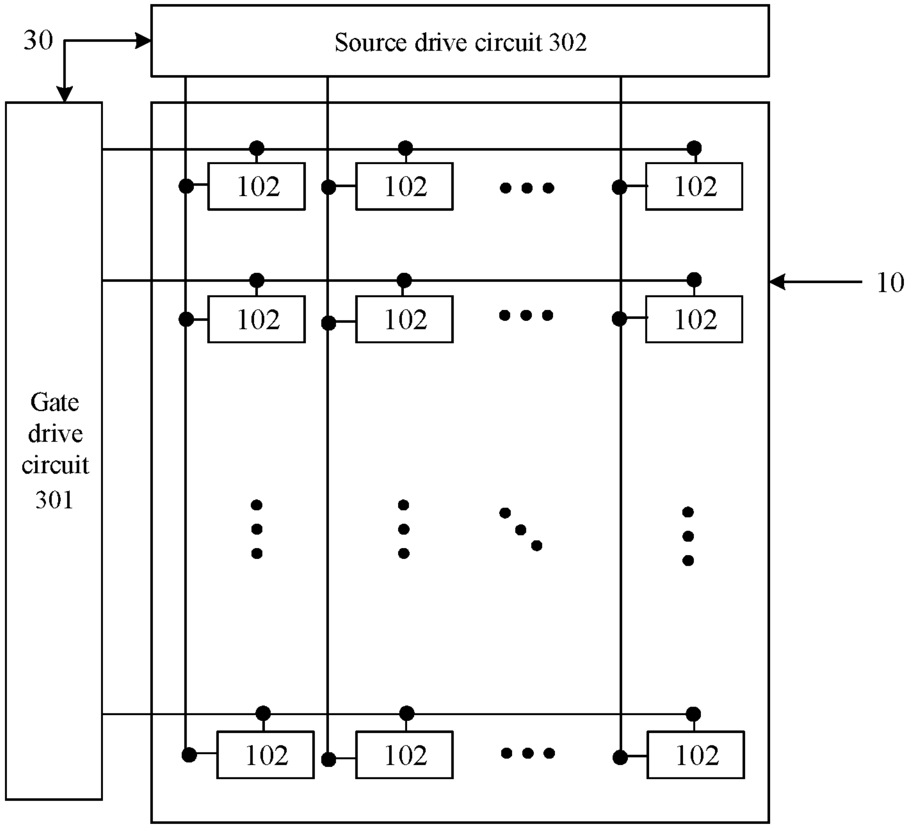
FIG. 17 is a schematic structural diagram of a display device according to an embodiment of the present disclosure.

FIG. 17 is a schematic structural diagram of a display device according to an embodiment of the present disclosure. Referring to FIG. 17, the display device may include a drive circuit 30 and the display panel 10 according to the above embodiments. The drive circuit 30 may be connected to a plurality of sub-pixels 102 in the display panel 10 and is configured to provide a drive signal for each of the sub-pixels.

Referring to FIG. 17, the drive circuit 30 includes a gate drive circuit 301 and a source drive circuit 302. The gate drive circuit 301 may be connected to each row of sub-pixels 102 in the display panel 10 by a gate line and is configured to provide a gate drive signal for each row of sub-pixels 102. The source drive circuit 302 may be connected to each column of sub-pixels 102 in the display panel 10 by a data line and is configured to provide a data signal for each column of sub-pixels 102.

In some embodiments, the display device may be any product or component with a display function and a fingerprint recognition function, such as an OLED display device, an electronic paper, a mobile phone, a tablet computer, a TV, a display, a notebook computer, a digital photo frame or a navigator.

The descriptions above are merely optional embodiments of the present disclosure and are not intended to limit the present disclosure. Within the spirit and principles of the disclosure, any modifications, equivalent substitutions, improvements, and the like are within the protection scope of the present disclosure.

What is claimed is:

1. A display panel, comprising:

a base substrate; and a plurality of sub-pixels disposed on a side of the base substrate, each of the sub-pixels comprising: a first electrode, a light-emitting film layer, and a second electrode laminated in sequence along a direction going away from the base substrate, wherein the first electrode comprises a first portion and a second portion surrounding the first portion, the first portion and the second portion being an integral structure, a thickness of the second portion being greater than a thickness of the first portion, the display panel further comprising:

an organic functional layer disposed between the first electrode and the second electrode;

wherein a sidewall of the second portion is perpendicular to a bearing surface of the base substrate, the organic functional layer does not cover the sidewall, the light-emitting film layer does not cover the sidewall and is discontinuous at the sidewall, the light-emitting film layers of adjacent sub-pixels are not connected, and the organic functional layers of adjacent sub-pixels are not connected, the display panel further comprising:

a protective layer;

wherein the protective layer covers a sidewall of the second portion close to the light-emitting film layer, to insulate the second portion from the light-emitting film layer.

2. The display panel according to claim 1, further comprising: a planarization layer;

wherein the planarization layer is disposed between the base substrate and the first electrode, and a surface of the first electrode close to the base substrate is a flat surface.

3. The display panel according to claim 1, wherein the protective layer comprises: a middle portion and an edge portion connected to the middle portion;

wherein an orthographic projection of the edge portion on the base substrate covers an orthographic projection of the second portion on the base substrate, and an orthographic projection of the middle portion on the base substrate covers a gap between the first electrodes of two adjacent sub-pixels.

4. The display panel according to claim 3, wherein a distance between the middle portion and the base substrate is smaller than a distance between the edge portion and the base substrate.

5. The display panel according to claim 1, wherein the protective layer is made from an inorganic material.

6. The display panel according to claim 1, wherein the protective layer has a thickness less than 20 nm.

7. The display panel according to claim 1, wherein the thickness of the second portion is 1.1 times to 1.5 times the thickness of the first portion.

8. The display panel according to claim 1, wherein the thickness of the first portion ranges from 50 nm to 1200 nm.

9. The display panel according to claim 1, wherein the light-emitting film layer comprises: a first light-emitting material layer and a second light-emitting material layer laminated in sequence along the direction going away from the base substrate;

wherein light emitted from the first light-emitting material layer and light emitted from the second light-emitting material layer is mixed into white light.

10. The display panel according to claim 9, further comprising: a color filter layer disposed on a side, away from the base substrate, of the plurality of sub-pixels;

wherein the color filter layer comprises a plurality of color resistance blocks of different colors, an orthographic projection of each of the sub-pixels on the base substrate being within an orthographic projection of one of the color resistance blocks on the base substrate.

11. The display panel according to claim 1, wherein a sidewall of the second portion is perpendicular to a bearing surface of the base substrate, and the light-emitting film layer does not cover the sidewall.

12. The display panel according to claim 1, wherein each of the sub-pixels further comprises: a transistor connected to the first electrode.

13. The display panel according to claim 1, wherein the display panel is a silicon-based organic light-emitting diode display panel.

14. A display device, comprising: a drive circuit and a display panel; wherein the display panel comprises a base substrate; and a plurality of sub-pixels disposed on a side of the base substrate, each of the sub-pixels comprising: a first electrode, a light-emitting film layer, and a second electrode laminated in sequence along a direction going away from the base substrate, wherein the first electrode comprises a first portion and a second portion surrounding the first portion, the first portion and the second portion being an integral structure, a thickness of the second portion being greater than a thickness of the first portion; and the drive circuit is connected to the plurality of sub-pixels in the display panel and is configured to provide a drive signal for each of the sub-pixels, the display panel further comprising:

an organic functional layer disposed between the first electrode and the second electrode;

wherein a sidewall of the second portion is perpendicular to a bearing surface of the base substrate, the organic functional layer does not cover the sidewall, the light-emitting film layer does not cover the sidewall and is discontinuous at the sidewall, the light-emitting film layers of adjacent sub-pixels are not connected, and the organic functional layers of adjacent sub-pixels are not connected, the display panel further comprising:

a protective layer;

wherein the protective layer covers a sidewall of the second portion close to the light-emitting film layer, to insulate the second portion from the light-emitting film layer.

15. The display device according to claim 14, wherein the display panel further comprises: a planarization layer disposed between the base substrate and the first electrode; and a surface of the first electrode close to the base substrate is a flat surface.

16. The display device according to claim 14, wherein the display panel further comprises: a protective layer covering the second portion, to insulate the second portion from the light-emitting film layer.

17. The display device according to claim 16, wherein the protective layer comprises: a middle portion and an edge portion connected to the middle portion;

wherein an orthographic projection of the edge portion on the base substrate covers an orthographic projection of the second portion on the base substrate, and an orthographic projection of the middle portion on the base substrate covers a gap between the first electrodes of two adjacent sub-pixels.

* * * * *